United States Patent
Sabisky et al.

[11] 4,063,158
[45] Dec. 13, 1977

[54] GAUSSMETER

[75] Inventors: Edward Stephen Sabisky, Trenton; Charles Hammond Anderson, Rocky Hill, both of N.J.

[73] Assignee: RCA Corporation, New York, N.Y.

[21] Appl. No.: 644,817

[22] Filed: Dec. 29, 1975

[51] Int. Cl.² ............................................. G01R 33/02
[52] U.S. Cl. .................................. 324/224; 350/151; 324/244; 324/248
[58] Field of Search ........................... 324/43 L, 43 R; 350/151

[56] References Cited

U.S. PATENT DOCUMENTS

| | | | |
|---|---|---|---|
| 2,844,789 | 7/1958 | Allen | 324/43 R |
| 2,879,401 | 3/1959 | Chicurel | 324/43 L |
| 2,913,665 | 11/1959 | Bomke | 324/43 R X |
| 2,968,799 | 1/1961 | Smith | 324/43 L |
| 3,257,608 | 6/1966 | Bell et al. | 324/43 R X |

*Primary Examiner*—Stanley T. Krawczewicz
*Attorney, Agent, or Firm*—H. Christoffersen; Samuel Cohen; William Squire

[57] ABSTRACT

An optical gaussmeter for determining the magnitude and homogeneity of the magnetic field in the core of a superconducting magnet includes a crystal of calcium fluoride doped with divalent thulium disposed in the core of the magnet. The crystal is exposed to RF radiation and to a narrow beam of light filtered to a wavelength corresponding to the absorption band of the divalent thulium in the crystal. The light beam signal as altered by the absorption characteristics of the crystal corresponds to the measured magnet current which manifests the field magnitude to be determined.

11 Claims, 3 Drawing Figures

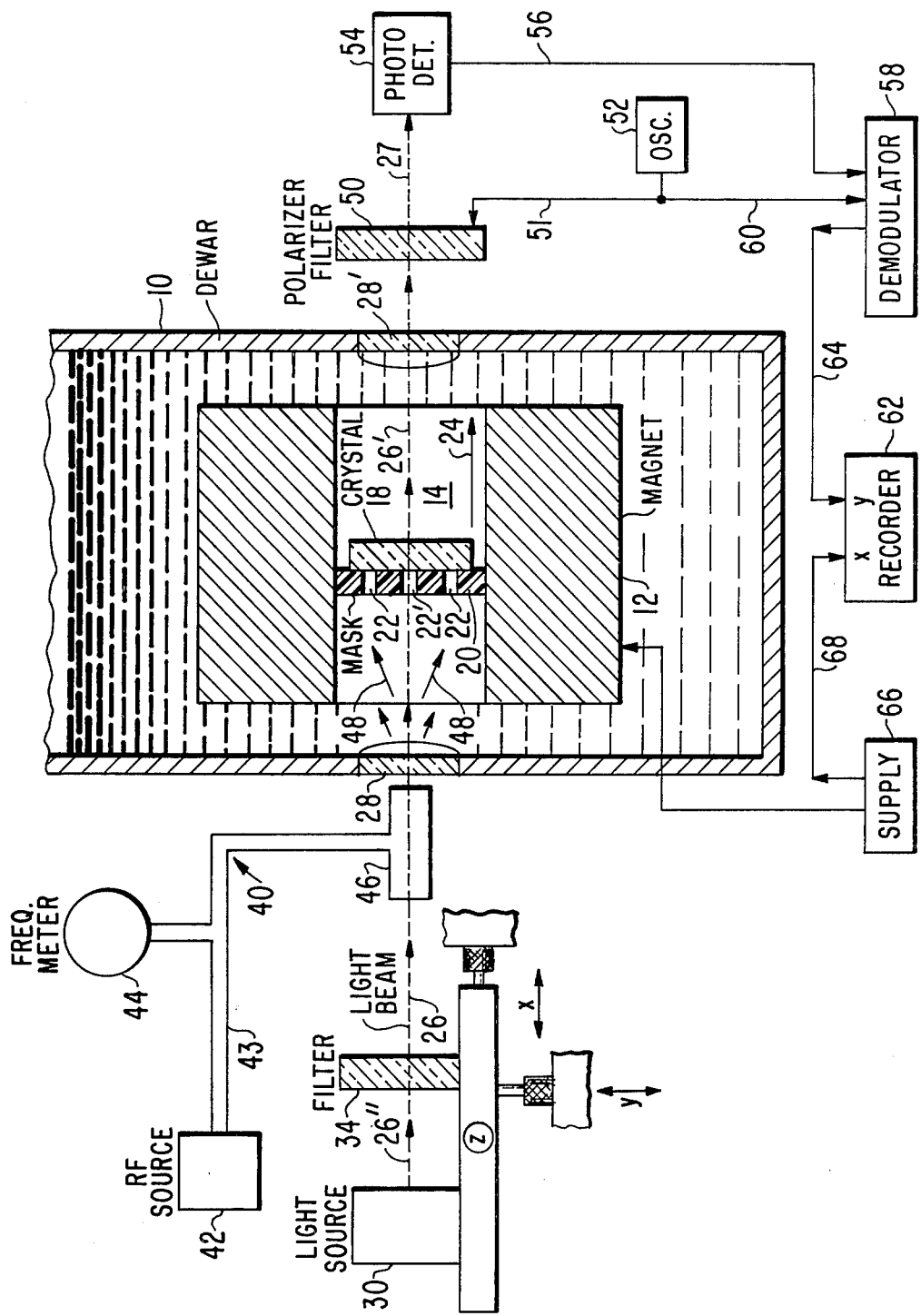

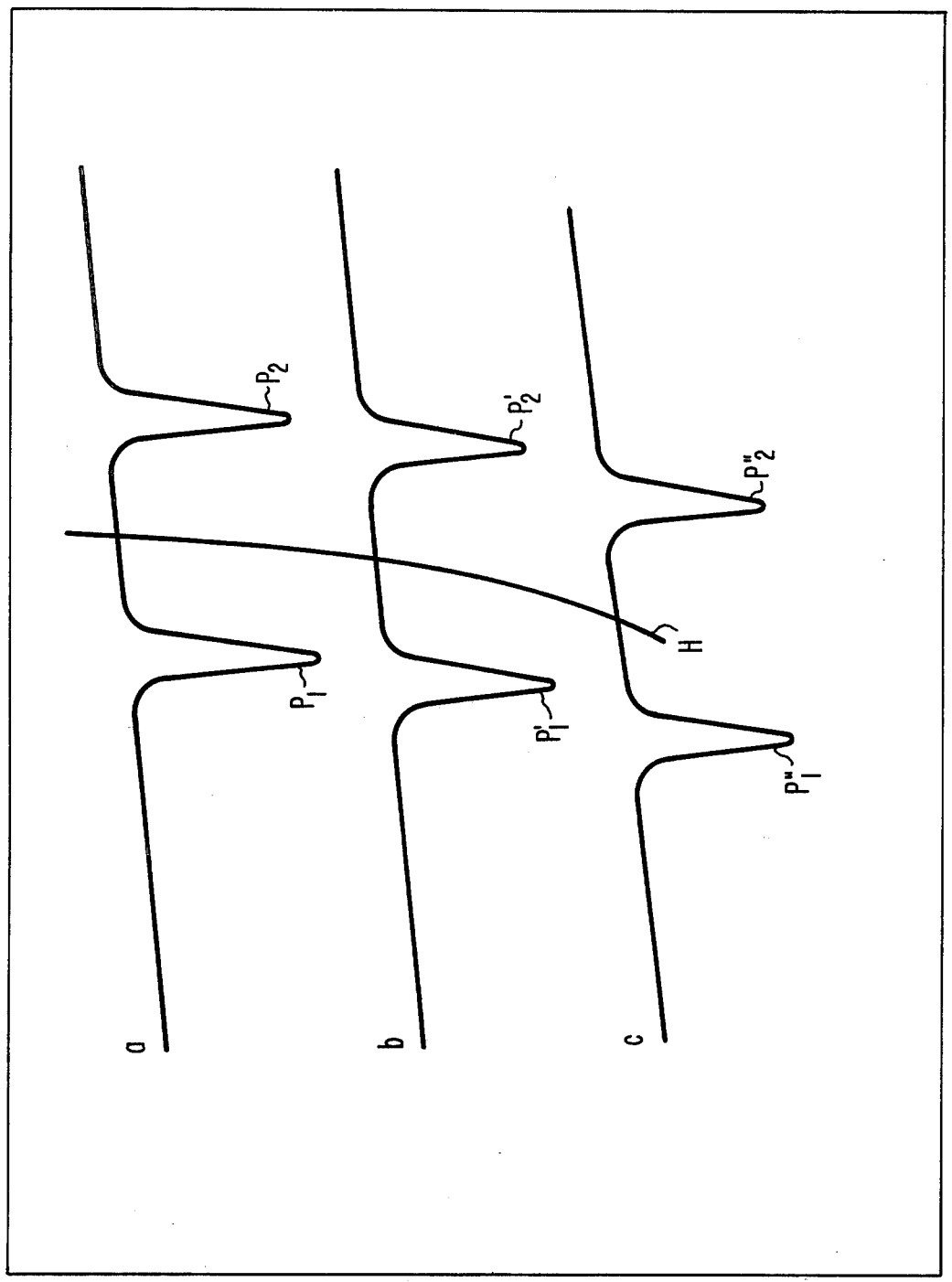

GAUSSMETER

FIELD OF THE INVENTION

The present invention relates to apparatus for measuring magnetic fields.

BACKGROUND OF THE INVENTION

Magnetic field strength is measured by a number of methods with the nuclear magnetic resonance (NMR) gaussmeter being the most widely used device when high accuracy and precision are required. In the NMR device, nuclei with magnetic moments absorb radio-frequency energy (RF) at unique resonant frequencies proportional to the applied magnetic field. This is accomplished with a marginal oscillator coupled to a probe which is inserted in the magnetic field whose strength is to be measured. The probe comprises one-half of a resonant circuit enclosing the material containing the nuclei. The magnetic field changes the properties of the resonant circuit in combination with the nuclear magnetic properties of the nuclei. As a result, the NMR gaussmeter translates the problem of the magnetic field measurement to one of frequency measurement which can be precisely determined. That is, the frequency of the marginal oscillator in combination with the probe inserted in the magnetic field produces a resonance in a circuit having a frequency corresponding to the magnetic field strength.

One application for measuring magnetic field strength is superconducting magnets. It is desirable to calibrate and determine the magnetic field homogeneity of these magnets at liquid helium temperatures, that is, at cryogenic temperatures. The measurement of the magnetic field at cryogenic temperatures in a dewar with a moveable probe is difficult and inaccurate. The inaccuracies result from the limited physical size of the resonating coil and probe core in relationship to the volume of the superconducting magnet core whose magnetic field homogeneity is to be determined. In essence, the probe is many orders of magnitude greater in size than that essential to measure with high accuracy the various shifts in homogeneity of the superconducting magnet field. In addition, some probes that are commercially available use liquids which are not suitable for cryogenic temperatures.

SUMMARY OF THE INVENTION

A gaussmeter includes means for providing an input beam of electromagnetic radiation. Electromagnetic radiation transmission means adapted to be disposed in a magnetic field to be determined are responsive to the input beam impinging thereon to produce an output beam of radiation manifesting the magnetic field. Positioning means are coupled to the beam providing means for locating the beam at a given position in the magnetic field. Radiation processing means responsive to the output beam intensity produce a signal representing the magnetic field magnitude at the given position.

IN THE DRAWING

FIG. 1 is an elevational schematic view of a system for determining the homogeneity of a magnetic field in the core of a superconducting magnet in accordance with one embodiment of the present invention.

FIG. 2 is a partial elevational view of an optical mask used in the system of FIG. 1.

FIG. 3 is a series of curves useful in explaining the embodiment of FIG. 1.

DETAILED DESCRIPTION

The system illustrated in FIG. 1 includes a conventional cryogenic dewar 10 whose construction details and mode of operation are well known and need not be further described herein. The dewar 10 receives a superconducting magnet 12 which is also a conventional device, the homogeneity of whose magnetic field at core 14 is to be determined. Disposed in core 14 at the location at which the magnetic field homogeneity is to be determined is a crystal 18 of calcium fluoride $CaF_2$ doped with 0.02% divalent thulium $T_m^{2+}$.

The crystal 18 in the presence of RF energy at a given frequency and a corresponding magnetic field causes a change in the intensity of the light of a given wavelength corresponding to the divalent thulium absorption bands. In essence, the crystal 18 optically detects the ground state paramagnetism of ions in solids using circular dichroism or Faraday rotation. The detection of ground state paramagnetism of ions is well known. For an ion having a simple ground state consisting of two Zeeman split energy levels in a magnetic field, a change in the circular dichroism or Faraday rotation can be described as a change in the population difference between the two states. The optical signal is directly proportional to the population difference $n_1 - n_2$ as follows $$(n_1 - n_2)/N = \text{Tan}h\, (g\beta H/2kT) \qquad (1)$$

where $n_1$, $n_2$ are the spin population densities in the two states; N is the total spin population; g is the spectroscopic splitting factor uniquely defined for each paramagnetic ion; T is the bath temperature; $\beta$ is the Bohr magneton, k is Boltzmann constant; and H is the magnetic field magnitude. For a given frequency, $\nu$, the resonance condition (2) $h\nu = g\beta H$, where h is Planck's constant, defines the magnetic field H through the value of g. At resonance, the paramagnetic ion absorbs RF energy changing $n_1 - n_2$ and consequently, also the optical signal. There are a number of ions which have the required properties and one large class is the F-center in various ionic solids. However, the F-center in various solids has relatively small circular dichroisms and a preferred system having much larger circular dichroism is calcium fluoride $CaF_2$ crystal doped with divalent thulium $T_m^{2+}$. This ion has broad absorption bands with large circular dichroism in the visible region of the spectrum, relatively narrow EPR (electron paramagnetic resonance) linewidths, long spin-lattice relaxation times, and is stable to temperature cycling.

The energy levels of $T_m^{2+}$ in $CaF_2$ are well known. The ground state has an effective spin $S = \frac{1}{2}$ and a nuclear spin $I = \frac{1}{2}$. As a result of the nuclear spin, the ion has four energy levels in a magnetic field and has a small zero fluid splitting A of 1101.376 ± 0.004 MHz. A is the hyperfine coupling constant and in this case it is equal to the zero field splitting. It provides a measure of the magnetic field produced by the nuclear spin acting on the electro spin or vice versa. The value for g is 3.451 ± 0.001 giving the ratio $g\beta/h$ of 4.830 ± 0.001 (GHz/KG). The relationship between frequency and field is given by $$\nu_{1,2} = \pm A/2 + g\beta H/2h + \frac{1}{2}[A^2 + (g\beta H/h)^2]^{\frac{1}{2}} \qquad (3)$$

For magnetic fields greater than 4 KG (kilogauss) to an accuracy of better than 0.1%, equation (3) is approximated by $$\nu_{1,2} = (g\beta H/h) \pm A/2 \quad (4)$$

For an applied frequency, $\nu$, two resonance lines separated by A are observed. The linewidth of the resonances is about 12 G for $CaF_2$ with 0.02% $T_m^{2+}$. With the magnetic field along the [100] direction of the crystal, the resonances show partially resolved fluorine hyperfine structure with the width of the center component about 2 G. The circular polarization properties of the broad 4f–5d absorption bands of $T_m^{2+}$ can be measured and it can be shown that the fraction of the circular dichroism reaches 40%.

For a further discussion of this phenomena reference is made to the following articles:

A. Kastler, J. Phys, Rad., 11, 255 (1950);
J. Brossel, Quantum Electronics, Columbia Univ. Press, New York, 1960, P. 81;
S. Geschwind, Electron Paramagnetic Resonance, Plenum Press, New York, 1972, Chapter 5;
C. H. Anderson, H. A. Weakliem and E. S. Sabisky, Phys. Rev. 143, 223, 1966;
R. G. Bessent and W. Hayes, Proc. Roy. Soc. A. 285, 430, 1965.

The crystal 18 thickness in direction 24 has a typical value of 0.030 inches for a 0.02% $T_m^{2+}$ doping. If a thinner sample is desired, the percentage of $T_m^{2+}$ doping in the crystal can be increased in order that a signal level be maintained. Thinner crystals provide less absorption and corresponding smaller signals. The magnetic field measured is the average value in the volume of the crystal the light passes through. The crystal should be kept as thin as possible so that the point at which the field is measured can be determined precisely. While $CaF_2$ is preferred, other suitable materials for crystal 18 can be used and include $SrF_2$, $BaF_2$ and $SrCl_2$.

The crystal 18 is secured by a suitable cement or other convenient means to a mounting structure and mask 20. Crystal 18 is disposed with its (100) axis extending in the direction 24. The mask 20 may be a small rod made of material transparent to radio frequency electromagnetic waves. The mask 20 includes radially displaced apertures 22, 22' disposed therein extending along the longitudinal direction 24 of core 14 (see FIG. 2). The position of mask 20 and apertures 22, 22' in the core 14 is determined by the locations in the core 14 at which the magnet 12 field homogeneity is to be determined. The mask 20, in the alternative, may be a circular disc or other suitable structural member which is fixed to the inner surface of core 14 and having disposed therein the strategically placed apertures 22 and 22'. When made of metal the mask would be positioned on the opposite side of crystal 18 to permit RF energy 48 to impinge on crystal 18 as will be explained. The spacing between the crystal 18 and the mask 20 is not critical. The mask 20 serves to reduce beam 26 to a pinpoint beam of light at a given location on crystal 18. This location has predetermined coordinates within the core 14. The apertures 22, 22' in one embodiment may have a transverse cross sectional area of about 0.2 square millimeters and are spaced from each other center-line to center-line about 2 millimeters, the core 14 having a transverse area (normal to direction 24) of about 0.08 square centimeters.

The dewar 10 has a pair of transparent windows 28 and 28' axially aligned with core 14 to permit a filtered light beam 26 to enter the interior of the dewar 10 via window 28 and the beam 26' passed by mask 20 and crystal 18 to exit the dewar 10 via window 28'. The interior of the dewar 10 is maintained at cryogenic temperatures by liquid helium or other suitable cryogenic mediums as is well known in the dewar art.

Disposed in alignment with core 14 and, in this case, aperture 22', in direction 24 is a light source 30. Light source 30 is any suitable light such as a tungsten bulb or other conventional source of polychromatic (white) light. Source 30 produces beam 26" having a transverse beam width sufficiently small to impinge upon one selected aperture 22, 22', as the case may be, (aperture 22' in FIG. 1). The surrounding portion of mask 20 masks out a portion of the beam should the beam width be greater than the transverse width of aperture 22". The intensity of beam 26" is of a suitable magnitude. In the example illustrated herein source 30 may be a 15 watt tungsten bulb. Source 30 is mounted on an adjustable mounting device 32. Device 32 is a suitable table or the like having micrometer adjustments in the x, y and z directions. The z direction is into the drawing, the x direction is in the direction 24, and the y direction is normal to the x-z plane. Directions x, y and z are orthogonal to one another. Device 32 is capable of aiming the beam 26" to any radial position within the core 14 in the direction 24 at a selected aperture 22, 22' via the x, y, and z adjustments. The beam 26" is passed through an optical filter 34 producing beam 26. Filter 34 filters the beam 26", filtering all wavelengths except that bandwidth to which the crystal 18 is responsive.

Disposed adjacent window 28 is RF energy producing device 40. Device 40 includes an RF source 42 coupled to an RF frequency meter 44 via suitable waveguide means 43, and to waveguide means 46 for directing RF energy 48 at the crystal 18. In the embodiment illustrated, the beam 26 is shown passing through the waveguide means 46. However, this is optional. The position of the means 46 may be anywhere adjacent the dewar and need only be positioned in a manner to saturate the crystal 18 with RF energy 48. Frequency meter 44 measures the frequency of the energy produced by source 42 as an aid in setting the frequency of the RF energy 48. Normally, the frequency meter is used to measure the RF frequency. It need not be set to any particular value. The current in the magnet is then set to those values at which the crystal is responsive, i.e.

$$H_{1,2} = (h\nu \pm Ah/2)/g\beta \text{ (Equation 3/inverted)} \quad (5)$$

Since the frequency $\nu$ and the parameters $h$, A, $g\beta$ are known, the magnetic field produced by those current values at which the crystal responds can be calculated. (See FIG. 3). It is to be understood that the RF device 40 is optional based on the type of crystal 18 used. A $CaF_2$ $T_m^{2+}$ crystal needs RF energy. Crystals of other materials may not. For example, $CaF_2$ containing divalent thulium and divalent holmium ions ($CaF_2:T_m^{2+}:H_o^{2+}$) does not require RF energy.

Disposed in the path of beam 26' is a polarizing filter 50 which is capable of circularly polarizing the beam 26' into left or right circularly polarized light in response to a signal received at input 51. Filter 50 is modulated by an oscillator 52. Filter 50 is a photoelastic modulator and is a device for modulating the polarization state of a light beam based on the photoelastic effect. This action produces light beam 27 which is of a given bandwidth and is alternately left and right circularly polarized. A sensitive photo-detector 54 is disposed to receive the beam 27 to provide an output signal on lead 56 which is an electrical signal representing the amplitude of the left and right circularly polarized light as manifested by beam 27. Lead 56 is connected to a demodulator 58 commonly referred to as a lock-in amplifier which receives the electrical signals produced by photodetector 54. Oscillator 52 has its output also connected to demodulator 58 via lead 60. The demodulator 58 serves as an a.c. to d.c. converter for converting the modulation signals appearing on lead 56 into a d.c. level manifesting the difference in amplitudes between the left and right circularly polarized light that is formed by beam 27. A lock-in amplifier is a commonly used instrument whose basic element is a phase sensitive detector in which the signal voltage is mixed with a reference voltage for producing a difference frequency about d.c. The d.c. signal produced by demodulator 58 is applied to a suitable recorder 62 via lead 64. Lead 64 is connected to one coordinate input of the recorder 62, for example, the y coordinate input.

A variable power supply 66 is connected to the magnet 12 to shift the value of the magnetic field in core 14 in accordance with the setting of the supply 66. An output of the supply is applied along lead 68 to a second coordinate input such as coordinate x of the recorder 62. The signal on lead 68 provides an x input to the recorder 62 representing the magnitude of the current supplied to the magnet 12 and thus the magnitude of the magnetic field in core 14. As will now be apparent, the system constructed and operated in accordance with the present invention optically detects the magnetic field strength taking advantage of electron paramagnetic resonance (EPR) as to be distinguished from prior art gaussmeters using the nuclear magnetic resonance technique (NMR) as described in the A. Kastler and J. Brossel references noted above.

The filtered light beam 26 is applied to a precise predetermined location on the crystal 18 via device 32 and mask 20 which location has predefined coordinates within the core 14, e.g., as determined by aperture 22'. When the crystal 18 of calcium fluoride doped with divalent thulium is exposed to RF radiation and a given magnetic field, the crystal absorbs a portion of the light in beam 26 forming beam 26'. A change in the absorption of light by the crystal 18 occurs when the magnetic field in the core 14 at that location is at a given magnitude. Current supply 66 is varied to vary the magnetic field. When an absorption of the beam 26 does occur as manifested in beam 26', the current from supply 66 is recorded by recorder 62 which at the same time records the absorption by the crystal 18 via the input at lead 64. The change in supply current required to produce the given magnetic field at core 14 is calculated to provide the actual magnetic field H. The absorption appears as a dip in a curve plotting signal intensity (circular dichroism) versus magnetic current as best seen in FIG. 3 curves a, b, and c, corresponding to a different respective aperture 22, 22'. Magnetic field intensity is determined by the center of the absorption dips $P_1$ and $P_2$ occurring in each of the curves a, b and c. Absorption dips $P_1$, $P_2$ represent that magnetic field which occurs at the location defined by aperture 22' and crystal 18. Waveforms a, b and c represent the respective waveforms produced by the apertures 22 and 22' at different radial positions in core 14. The signal intensities of the three waveforms a, b and c are different because of experimental differences and is not significant. Note that the dips $P_1$, $P_1'$ and $P_1''$ for the three different locations within core 14 are displaced with respect to the magnet current. The waveform c produces the dip $P_1''$ at a lower magnet current than the dip $P_1$ of waveform a. The magnet current having been calibrated by standard methods provides a direct reading of the magnetic field H. The reason there are two dips $P_1$ and $P_2$ is that divalent thulium has a nuclear spin $I=\frac{1}{2}$. This means that the ground state is split into four levels under application of a magnetic field and therefore two absorption dips for a given frequency separated by a fixed amount. The low field dip or resonance is for those ions in which the magnetic field of the nucleus is substrated from the external magnetic field. The high field dip occurs for those ions in which the nuclear magnetic field is added to the external field.

The curves represented by waveforms a, b and c slope slightly upward due to the different being taken between the ground state of the paramagnetic ions. That is, the polarizing filter 50 when providing the right circularized polarization provides one state, for example, $n_1$; and when left polarized, the filter 50 provides the second state, that is, $n_2$. Photodetector 54 detects the amplitude of the light beam produced in each of the two states. Demodulator 58 provides a signal representing the difference between the two ground states or $n_1-n_2$ which as shown in equation (1) is proportional to the magnetic field H. This difference shifts in level for different magnetic fields and thus accounts for the slight slope in the waveforms a, b and c. The difference in the ground states is taken rather than the absolute values to provide higher resolution to the system. It will occur to those skilled in the art that the difference need not be taken but the absolute value of the magnetic current producing a particular absorption dip can be determined without filter 50 utilizing a simple photodetector and recording system. As known by the state of the art modulation and demodulation as illustrated in FIG. 1 provides increased resolution.

It will thus be appreciated that a system has been described which will conveniently and quickly measure the magnetic field magnitude and homogeneity in a superconducting magnet operating at cryogenic temperatures having a high degree of resolution. An illustrative example of the parameters producing the curves of FIG. 3 are: frequency of the RF source 42, 34.4 GHz, the temperature T, 1.30K, and the magnetic field H, 7.11 KG. It will occur to those skilled in the art that the optical magnetic field detection device described herein may be modified to operate with a magnet at room temperature as well.

What is claimed is:

1. A gaussmeter comprising:
   means for providing an input beam of electromagnetic radiation of relatively restricted cross-section and having a bandwidth in the visible spectrum,
   electromagnetic radiation transmission means including a crystal adapted to be disposed in a magnetic field whose magnitude is to be determined, said crystal being responsive to said beam impinging thereon for producing an output beam of radiation manifesting the magnitude of said magnetic field,
   positioning means coupled to said beam providing means for locating said beam at a given position on a portion of said crystal in said magnetic field, and
   radiation processing means responsive to said output beam applied as an input thereto for producing as an output thereof a signal representing said magnetic field magnitude at said given position.

2. The gaussmeter of claim 1 wherein said crystal is made of material responsive to said beam at cryogenic temperatures.

3. The gaussmeter of claim 1 wherein said transmission crystal means includes means for absorbing a portion of said input beam of electromagnetic radiation solely at a given magnetic field magnitude,
said processing means including means responsive to said partially absorbed beam for producing said output signal.

4. The gaussmeter of claim 1 wherein said transmission means includes means for receiving a superconducting magnet at cryogenic temperatures, said receiving means being arranged to permit said beams to pass therethrough and through the core of said superconducting magnet.

5. The gaussmeter of claim 1 wherein said crystal has a given transverse area facing said beam,
said beam providing means including means for providing said beam with a transverse area smaller than said given transverse area,
said positioning means locating said beam at any selected portion of said given area whereby said magnetic field magnitude signal represents said magnitude at said selected portion.

6. The gaussmeter of claim 1 wherein said transmission means includes a $CaF_2$ crystal doped with $T_m^{2+}$ for receiving said input beam and for producing said output beam, and
radiation generating means coupled to said transmission means for exposing said $CaF_2$ crystal to radio frequency radiation.

7. An optical gaussmeter comprising:
a crystal disposed in the magnetic field whose intensity is to be measured, said crystal having the property, when illuminated by light, of absorbing a portion of said light when the magnetic field is of a particular intensity,
means for producing a light beam of relatively small cross-sectional area compared to the area of a face of said crystal,
means for directing said light beam to any one of a number of locations, each of restricted size, on said face of said crystal, and
light detecting means disposed to receive the portion of said beam which passes through said crystal for providing an output signal representing the magnitude of said magnetic field at the location illuminated by said beam.

8. The gaussmeter of claim 7 further including:
filter means disposed between said means for producing a beam of light and said crystal for providing filtered light to said crystal at a given frequency, and said crystal being responsive to said filtered light frequency,
polarizing means disposed between said light detecting means and said crystal for alternatively filtering said transmitted beam into left and right circularly polarized light, and
said light detecting means including means for subtracting the difference in intensities between the detected intensities of said right and left circularly polarized light.

9. The gaussmeter of claim 7 further including superconducting magnet receiving means for receiving a superconducting magnet at cryogenic temperatures and operating said magnet at a plurality of magnetic fields.

10. The gaussmeter of claim 7 wherein said means for directing includes light mask means formed with a plurality of apertures therein disposed between said crystal and said beam producing means, and means for causing said light beam to pass through only one of said apertures.

11. A gaussmeter comprising:
means for providing an input beam of electromagnetic radiation,
electromagnetic radiation transmission means adapted to be disposed in a magnetic field to be determined, said transmission means being responsive to said beam impinging thereon for providing an output beam of radiation manifesting the magnitude of said magnetic field, said transmission means including a $CaF_2$ crystal doped with $T_m^{2+}$ for receiving said input beam and for producing said output beam, and radiation generating means coupled to said transmission means for exposing said $CaF_2$ crystal to radio frequency radiation,
positioning means coupled to said beam providing means for locating said beam at a given position in said magnetic field, and
radiation processing means responsive to said output beam applied as an input thereto for producing as an output thereof a signal representing said magnetic field magnitude at said given position.

* * * * *